(12) United States Patent
Bhattacharya

(10) Patent No.: US 8,395,317 B2
(45) Date of Patent: Mar. 12, 2013

(54) TEXTILE FOR CONNECTION OF ELECTRONIC DEVICES

(75) Inventor: Rabin Bhattacharya, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1006 days.

(21) Appl. No.: 12/444,419

(22) PCT Filed: Oct. 3, 2007

(86) PCT No.: PCT/IB2007/054013
§ 371 (c)(1), (2), (4) Date: Apr. 6, 2009

(87) PCT Pub. No.: WO2008/044167
PCT Pub. Date: Apr. 17, 2008

(65) Prior Publication Data
US 2010/0013406 A1    Jan. 21, 2010

(30) Foreign Application Priority Data

Oct. 10, 2006  (EP) ..................................... 06122040
Apr. 19, 2007  (EP) ..................................... 07106514

(51) Int. Cl.
*H01J 1/62* (2006.01)
(52) U.S. Cl. ...................................... 313/511; 313/491
(58) Field of Classification Search ................... 442/181, 442/185, 186, 203, 301, 205–231; 139/11, 139/269, 273, 319, 420 R, 425 R; 313/511, 313/491, 505, 584, 631
See application file for complete search history.

(56) References Cited

U.S. PATENT DOCUMENTS

| 3,803,437 | A | * | 4/1974 | Robinson | 313/483 |
| 5,469,020 | A | * | 11/1995 | Herrick | 313/511 |
| 5,962,967 | A | * | 10/1999 | Kiryuschev et al. | 313/491 |
| 6,608,438 | B2 | * | 8/2003 | Topelberg et al. | 313/511 |
| 7,144,830 | B2 | * | 12/2006 | Hill et al. | 442/205 |

FOREIGN PATENT DOCUMENTS
WO        03095729 A1    11/2003

* cited by examiner

*Primary Examiner* — Tung X Le

(57) ABSTRACT

A textile (100; 300; 400) having a multi-layer warp which includes an upper warp layer (101) comprising an upper array of conductive warp yarns (104*a-b*; 303*a-e*; 406*a-b*), a lower warp layer (102) comprising a lower array of conductive warp yarns (106*a-b*; 306*a-e*; 421*a-d*), and an intermediate warp layer (103) arranged between the upper (101) and lower (102) warp layers. The textile further includes a weft in which a first set of conductive weft yarns (108; 302*a-f*; 407*a-b*) cross the upper array of conductive warp yarns (104*a-b*, 303*a-e*; 406*a-b*), such that electrical contact is achieved there between, and a second set of conductive weft yarns (109*a-b*; 305*a-f*; 424, 430, 440) cross the lower array of conductive warp yarns (106*a-b*; 306*a-e*; 421*a-d*), such that electrical contact is achieved there between. The second set of conductive weft yarns (109*a-b*; 305*a-f*; 424, 430, 440) form loops (110; 425, 431, 441) around non-conductive warp yarns in the upper (101) and intermediate (103) warp layers, each of the loops (110; 425, 431, 441) providing a first upper layer connection point (307; 408-410) for enabling connection of an electronic device (309; 401-403) between the first upper layer connection point (307; 408-410) and a second upper layer connection point (308).

10 Claims, 7 Drawing Sheets

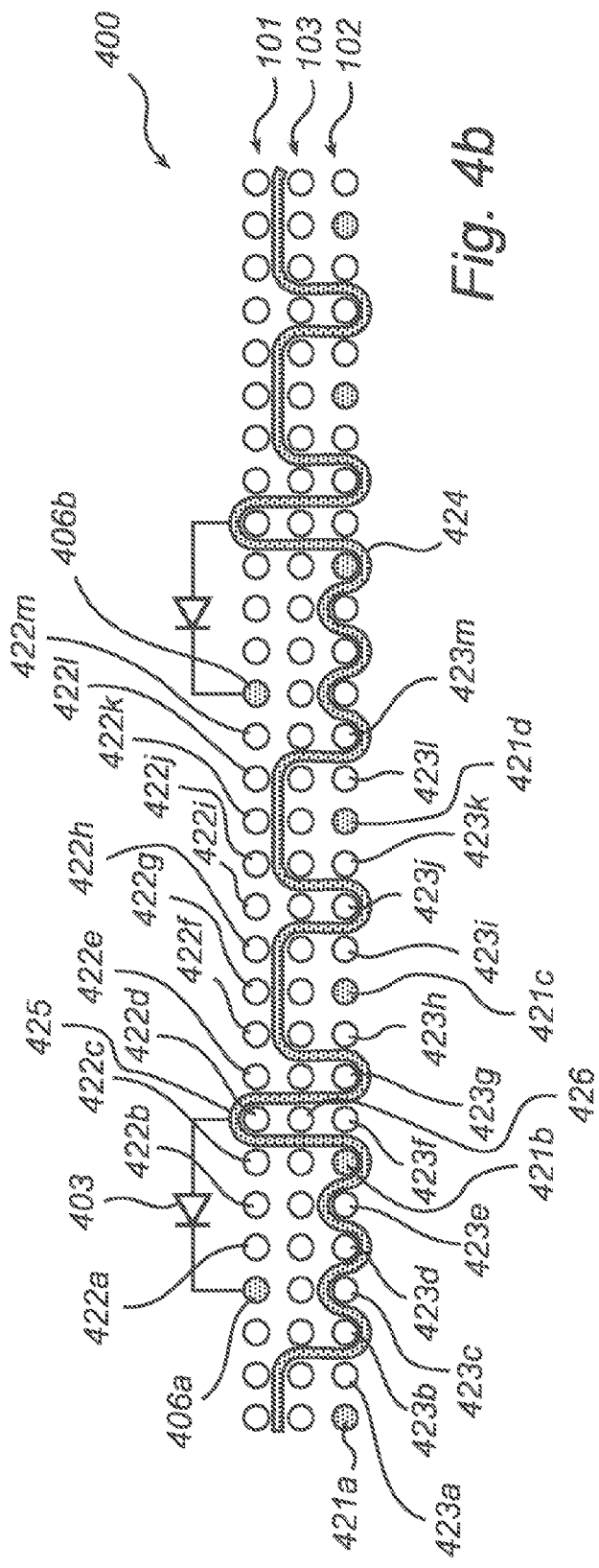
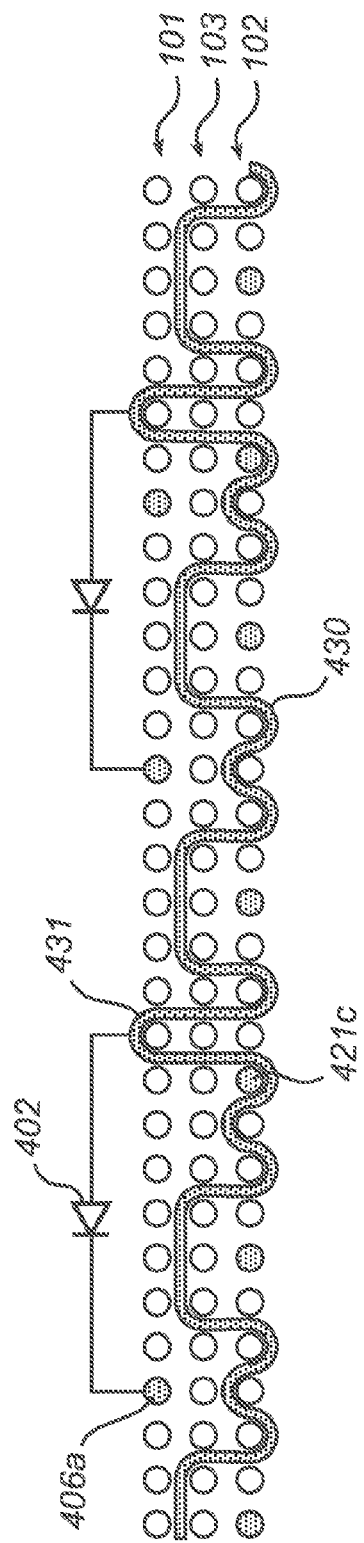
Fig. 4b
Fig. 4c

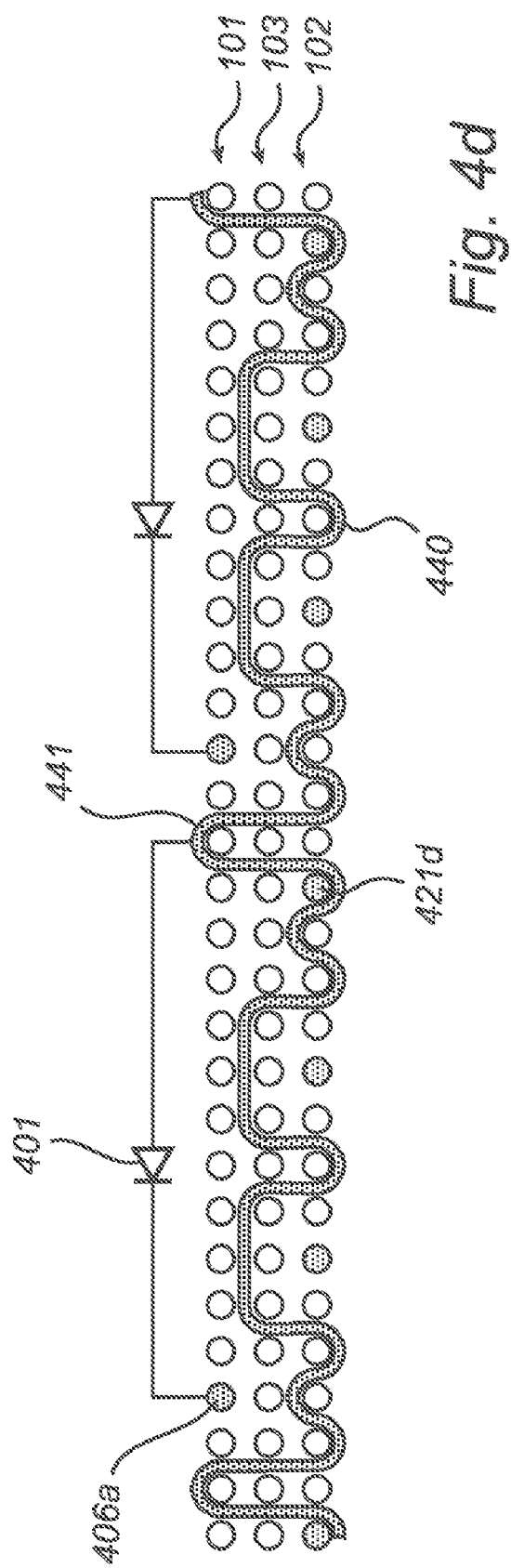

TEXTILE FOR CONNECTION OF ELECTRONIC DEVICES

TECHNICAL FIELD OF THE INVENTION

The present invention relates to a textile, for enabling connection of electronic devices, formed from interwoven electrically conductive and non-conductive yarns, and an electronic textile comprising such a textile.

TECHNICAL BACKGROUND

Currently, research in the field of electronic textiles is very active, and although not a great deal of advanced electronic textile products can be found in the market-place today, it is expected that many new products will find their way to the consumers in the near future.

One example of a product group that is expected to appeal to consumers is products made from actively light-emitting textiles. Such textiles, which may have a matrix of light sources, such as light-emitting diodes (LEDs), connected to a power supply and, optionally, a LED-controller via a conductor pattern provided in the fabric, may be used to make domestic textiles, such as curtains or pillow covers, and clothes.

In WO 03/095729, an embodiment is disclosed, in which functional yarn including a plurality of LEDs is interwoven with conductive and non-conductive yarns to form an addressable passive-matrix display in which the LEDs may be individually addressed.

In a passive-matrix type electronic textile, such as that disclosed in the above-referenced document, both the row and column conductors leading from a power supply to a certain LED need to be intact for the particular LED to be operable. This is a disadvantage of this type of electronic textiles, since textiles as a rule need to be cut into suitable shapes and measures in order to allow manufacturing of domestic textiles or clothes.

There is thus a need for an electronic textile that can be cut to measure without losing its functionality.

OBJECTS OF THE INVENTION

In view of the above-mentioned and other drawbacks of the prior art, a general object of the present invention is to provide an improved textile for connection of electronic devices.

A further object of the present invention is to provide an electronic textile that can be cut to measure without losing its functionality.

SUMMARY OF THE INVENTION

According to a first aspect of the invention, these and other objects are achieved through a textile, for enabling connection of electronic devices, formed from interwoven electrically conductive and non-conductive yarns, comprising a multi-layer warp including an upper warp layer which comprises an upper array of conductive warp yarns; a lower warp layer which comprises a lower array of conductive warp yarns; and an intermediate warp layer arranged between the upper and lower warp layers; and a weft which comprises electrically conductive and non-conductive weft yarns. In the textile, a first set of conductive weft yarns cross the upper array of conductive warp yarns, such that electrical contact is achieved there between, and a second set of conductive weft yarns cross the lower array of conductive warp yarns, such that electrical contact is achieved there between, wherein the second set of conductive weft yarns, at selected loop locations, form loops around non-conductive warp yarns in the upper and intermediate warp layers, each of the loops providing a first upper layer connection point for enabling connection of an electronic device between the first upper layer connection point and a second upper layer connection point provided on one of a conductive warp yarn from the upper array of conductive warp yarns and a conductive weft yarn from the first set of conductive weft yarns.

The textile according to the present invention provides a large number of connection paths to each pair of connection points for connection of an electronic device. Hereby, an electronic textile formed from the textile according to the present invention can be make very robust to cuts in the textile. In other words, even if many of the connection paths leading to a certain electronic device are broken, there is a high probability that some connection paths will remain so that the electronic device will be able to function as if nothing had happened. This means that the electronic textile, through the use of a textile according to the present invention, can be cut to measure without influencing the operation of the electronic devices in the electronic textile. With proper positioning of a power supply, or redundancy of power supplies, this is even the case when the electronic devices in the electronic textile are powered and operating.

In the textile according to the present invention, the first set of conductive weft yarns may, at selected loop locations, form loops around non-conductive warp yarns in the lower and intermediate warp layers, each of the loops providing a first lower layer connection point for enabling connection of an electronic device between the first lower layer connection point and a second lower layer connection point provided on one of a conductive warp yarn from the lower array of conductive warp yarns and a conductive weft yarn from the second set of conductive weft yarns.

In this manner, double-sided connection of electronic devices to the textile is enabled.

Furthermore, electrical contact may be achieved between each of the conductive yarns in the upper array of conductive warp yarns and the first set of conductive weft yarns, such that an upper conductive grid is formed comprising a plurality of upper grid elements, and between each of the conductive yarns in the lower array of conductive warp yarns and the second set of conductive weft yarns, such that a lower conductive grid is formed comprising a plurality of lower grid elements, and the loop locations may be selected such that the loops enable connection of an electronic device between the upper and lower conductive grids for each grid element in at least one of the upper and lower grids. Through this arrangement, a very large number of connection paths is ensured between a power supply and an electronic device connected to the textile.

According to one embodiment of the present invention, at least the lower warp layer comprises a plurality of lower arrays of conductive warp yarns, and the conductive weft yarns are divided into a plurality of sets, wherein each of the lower arrays of conductive warp yarns is crossed by a corresponding set of conductive weft yarns from the plurality of sets, such that electrical contact is achieved there between.

Through this embodiment of the invention, separate power supply and/or control of several sets of connected electronic devices, such as, for example, differently colored LEDs is enabled, while maintaining the ability to be cut to measure without influencing the operation of electronic devices.

According to another embodiment of the present invention, at least a fraction of the loops may each be formed around a larger number of non-conductive warp yarns in the intermediate layer than in the upper layer.

In this way, the intermediate layer(s) of the multilayer weave are involved to a greater degree in the weaving, which enables the formation of a stronger weave having improved integrity. In cases when loops are formed by the first set of conductive weft yarns, these loops may, of course, analogously be formed around a larger number of non-conductive warp yarns in the intermediate layer than in the lower layer.

For example, loops may be formed by traversing the weave in a step-wise manner, so that a loop is formed around a decreasing number of yarns from the origin of the loop to the turning portion of the loop. For the simplest case with a three layer weave, a loop may, for example, be formed around three warp yarns in the lower layer, two warp yarns in the intermediate layer and one warp yarn in the upper layer.

The textile according to the present invention may, furthermore, be comprised in an electronic textile, further comprising a plurality of electronic devices, each being connected to the first and second connection points of the textile.

The electronic devices may include any kind of device which is connectable to the textile according to the present invention. Although it is envisioned that the textile of the invention is most suitable for several identical components or groups of components, such as LEDs or sensors, other configurations are possible.

One or several power supplies may be connected to the textile at connection locations provided for that purpose, and/or power supply connectors may be provided for enabling connection of external power at one or, preferably, several locations across the textile. For example, such connections for external power may be provided at regular intervals in the warp and/or weft directions.

According to one embodiment of the electronic textile, each of the electronic devices may comprise a light-emitting diode.

Each of said electronic devices may further comprise stabilizer circuitry for compensating for different light-emitting diodes having different characteristics.

When, as is typically the case, different LEDs have different voltage-luminance characteristics, different (even very different) amounts of current will flow through different LEDs in the absence of stabilizer circuitry. This would lead to a non-uniform appearance of the LED-matrix electronic textile which may be undesirable to a user.

Such a stabilizer circuitry may advantageously comprise a resistor.

By adding a resistor in series with each LED, the current through the LEDs is limited and, to a certain degree, normalized.

The stabilizer circuitry may further comprise at least one transistor, whereby a more efficient normalization of the current to the LEDs can be realized.

Especially good uniformity may be obtained through implementing a so-called current mirror for each LED.

BRIEF DESCRIPTION OF THE DRAWINGS

These and other aspects of the present invention will now be described in more detail, with reference to the appended drawings showing currently preferred embodiments of the invention, wherein:

FIG. 4b is a cross-section view, in the warp direction, of the textile in FIG. 4a along the line B-B;

FIG. 4c is a cross-section view, in the warp direction, of the textile in FIG. 4a along the line C-C;

FIG. 4d is a cross-section view, in the warp direction, of the textile in FIG. 4a along the line D-D;

DETAILED DESCRIPTION OF PREFERRED EMBODIMENTS OF THE INVENTION

In the following description, the present invention is described with reference to a textile having three warp layers and certain, simplified, weave layouts. This should by no means limit the scope of the present invention, which is equally applicable to textiles having a larger number of warp layers, as well as other kinds of weave layouts.

Furthermore, the exemplary electronic textiles described below include LEDs. This should, obviously, not be construed as excluding electronic textiles having other kinds of electronic devices. On the contrary, electronic textiles with any kind of electronic devices, such as sensors, lighting devices, communication devices, etc, connected to a textile according to the present invention should be considered to fall within the scope of the present invention.

In the description below, it is repeatedly referred to warp and weft yarns. In weaving, yarns with a general extension in the direction of weaving are commonly referred to as warp yarns, while yarns that extend substantially perpendicularly to the weaving direction (and to the warp yarns) are referred to as weft yarns. Although warp and weft yarns are typically perpendicular to each other, this is not necessarily the case, and the present invention should not be seen as limited to having warp and weft yarns that are perpendicular to each other.

Figure 1A:
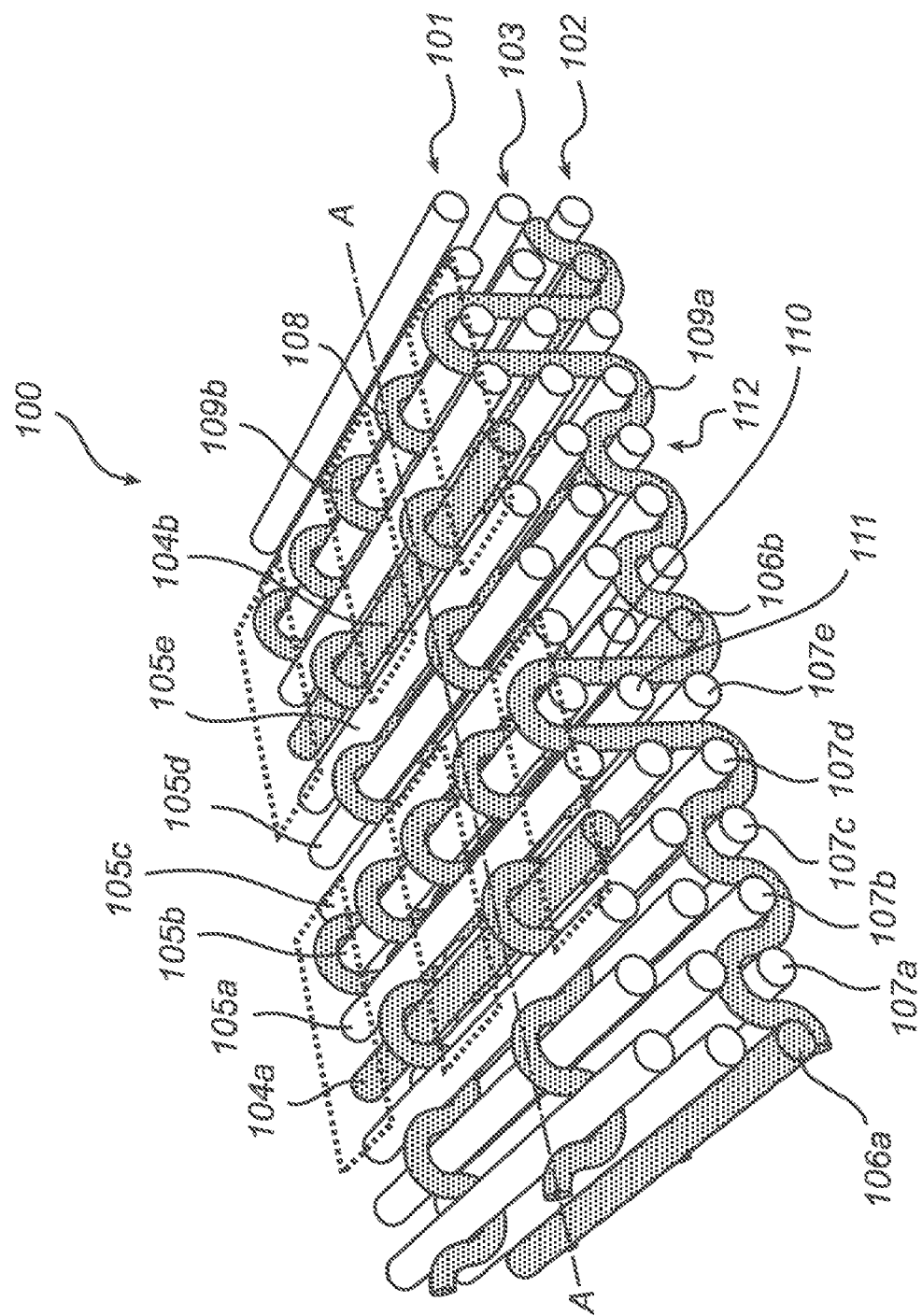
FIG. 1a is a schematic perspective cross-section view of a textile according to a first embodiment of the present invention.

In FIG. 1a, a three-layer woven textile 100 according to a first embodiment of the present invention is schematically shown having an upper 101 and a lower 102 warp layer which are separated by an intermediate warp layer 103. The upper warp layer 101 comprises an array of conductive warp yarns 104a-b separated by non-conductive warp yarns 105a-e, and the lower warp layer 102, in the presently illustrated example, has an identical, but translated, configuration of conductive 106a-b and non-conductive 107a-e warp yarns. The intermediate warp layer 103 here consists of all non-conductive warp yarns. However, this is not necessarily the case.

In the weft direction, one conductive weft yarn 108 from a first set of conductive weft yarns and two conductive weft yarns 109a-b from a second set of conductive weft yarns can be seen in FIG. 1a. Non-conductive weft yarns may be present between the conductive weft yarns shown in FIG. 1a, but have here been omitted for the sake of clarity.

Referring again to FIG. 1a, the conductive weft yarn 109a can be seen to alternatingly go over and under the non-conductive warp yarns in the lower warp layer 102 until crossing the non-conductive warp yarn 107d after which the conductive weft yarn 109a forms a loop 110 around one non-conductive warp yarn 107e in the lower warp layer 102, one non-conductive warp yarn 111 in the intermediate layer 103 and one non-conductive warp yarn 105b in the upper warp layer 101. Continuing to follow the same conductive weft yarn 109a, it next crosses the conductive warp yarn 106b in the lower warp layer 102 so that electrical contact is achieved there between. Through such crossings between the conductive weft yarns 109a-b of the second set of conductive weft yarns and conductive warp yarns 106 in the lower warp layer 102, a lower conductive grid is formed on the lower warp layer side 112 of the textile 100. As explained above, each conductive weft yarn 109a-b of the second set forms a plurality of loops, which are all electrically connected to the lower conductive grid.

Similarly, the conductive weft yarns 108 of the first set of conductive weft yarns form an upper conductive grid together with the conductive warp yarns 104 in the upper warp layer 101. The conductive weft yarns 108 of the first set may simply assist in forming the upper conductive grid, or may, as illustrated in FIG. 1b, form loops 113 to the lower side 112 of the textile 100 in the same way as described above for the loops 110 extending from the lower side 112 of the textile 100.

Figure 1B:
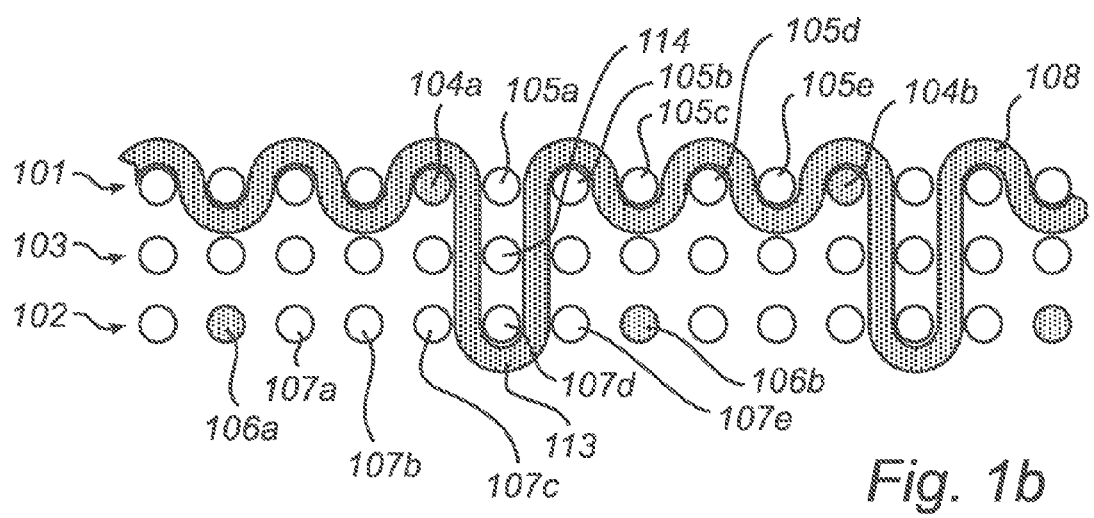
FIG. 1b is a cross-section view, in the warp direction, of the textile in FIG. 1a along the line A-A.

Referring to FIG. 1b, showing a schematic cross-section of the textile 100 in FIG. 1a along the line A-A, the conductive weft yarn 108 of the first set of conductive weft yarns crosses and makes electrical contact with the conductive warp yarn 104a in the upper warp layer 101 before forming a loop 113 around the non-conductive warp yarn 105a in the upper layer, the non-conductive warp yarn 114 in the intermediate warp layer 103 and the non-conductive warp yarn 107d in the lower warp layer 102.

Figure 2:
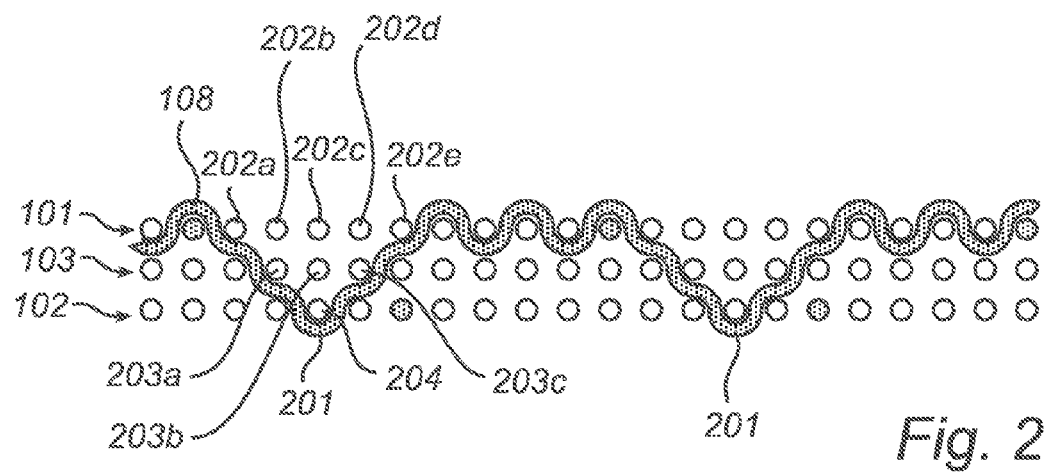
FIG. 2 is a schematic cross-section view, in the warp direction, of a textile according to a second embodiment of the present invention.
Figure 3:
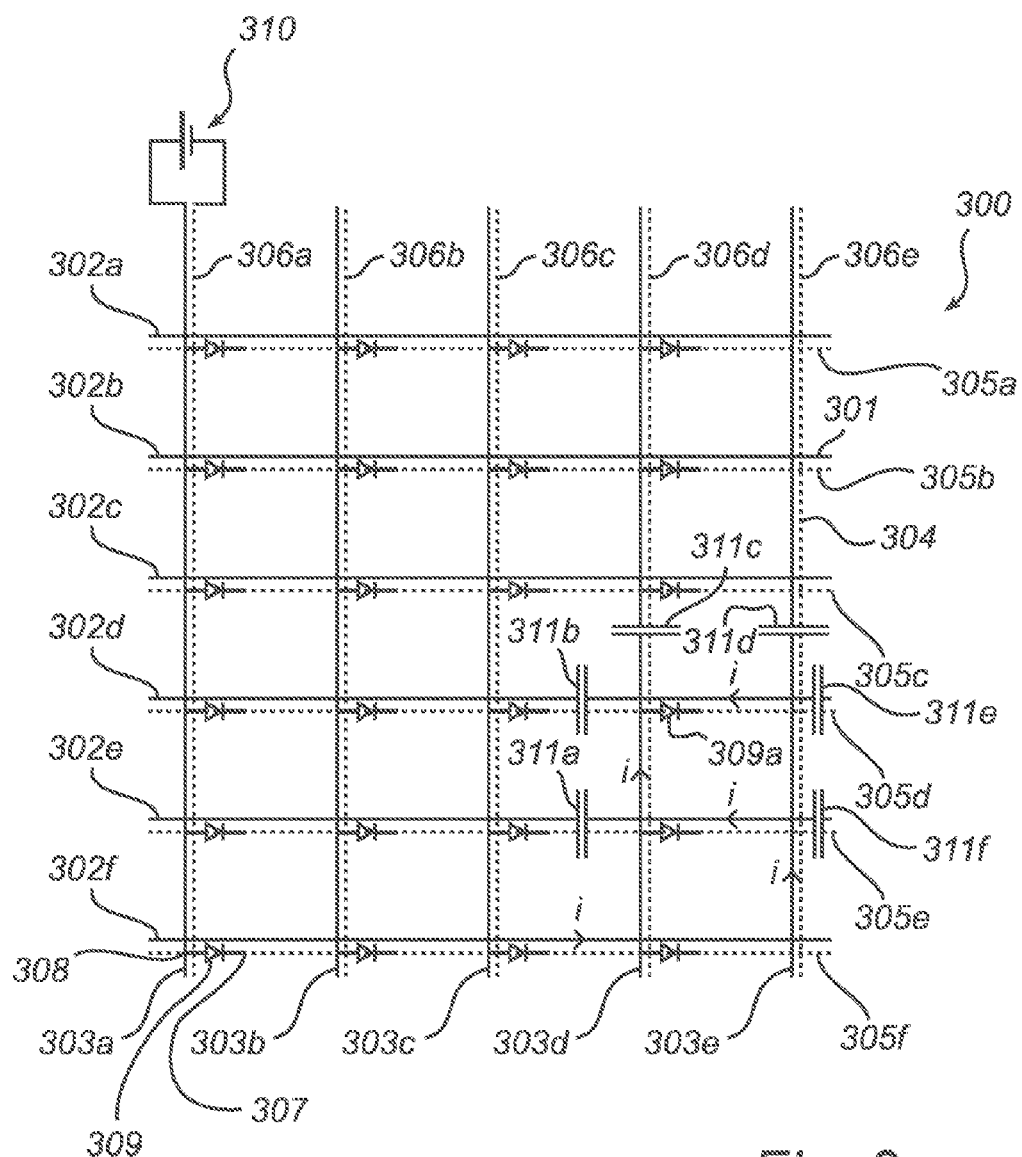
FIG. 3 is a schematic view illustrating the robustness of an electronic textile utilizing a textile according to an embodiment of the present invention.

In FIG. 2, schematically illustrating a second embodiment of the textile according to the present invention, loops 201 are shown, which are formed by conductive weft yarns 108 of the first set of conductive weft yarns, around non-conductive yarns 202a-e in the upper warp layer 101, non-conductive yarns 203a-c in the intermediate warp layer 103 and the non-conductive yarn 204 in the lower warp layer 102. According to this embodiment, the conductive weft yarns 108 interact to a greater degree with the warp yarns of the intermediate warp layer 103, leading to a better anchoring of the conductive weft yarns 108. FIG. 3 is a schematic view illustrating the robustness of an electronic textile utilizing a textile according to an embodiment of the present invention.

In FIG. 3, a conductor pattern of a portion of an electronic textile 300 is schematically shown, where the upper layer conductive grid 301 is indicated by the solid grid lines in rows 302a-f and columns 303a-e, and the lower layer conductive grid 304 is indicated by the dotted grid lines in rows 305a-f and columns 306a-e.

From the lower layer conductive grid 302, loops are formed in the conductive weft, resulting in the indicated connection points 307 in each upper grid element (only one loop connection point is indicated by a reference numeral to avoid cluttering the figure). Between each of these connection points and corresponding connection points 308 of the upper conductive grid, a LED 309 is connected (once again, only one each of these are indicated by reference numerals).

In order to power the LEDs, a power supply, here simply indicated as a voltage source 310 is connected between the upper and lower conductive grids 301, 304. In order to demonstrate the robustness of an electronic textile based on the textile according to the present invention, a situation will now be illustrated which corresponds to the electronic textile being cut to measure while the LEDs 309 are powered by the power supply 310 via the upper and lower conductive grids 301, 304.

With continued reference to FIG. 3, cuts are made in the electronic textile 300 on several sides of a LED 309a, more specifically, cuts 311a-f are made through grid lines 302e and 305e, 302d and 305d, 303d and 306d, and 303e and 306e, respectively at the indicated locations. Had the electronic textile been a conventional row-column addressable LED-matrix, then the partly isolated LED 309a would at this point not be emitting light. When, on the other hand, a textile according to an embodiment of the present invention is used, the LED 309a will still be powered in the illustrated situation, with several remaining current paths, as indicated by arrows and the letter i in FIG. 3.

With reference to FIGS. 4a-d, a textile 400 according to a third embodiment of the present invention, enabling connection of three independent electronic devices 401, 402, 403, here in the form of LEDs, for every upper grid element 404 of the textile 400 will be described in the following.

As described previously in connection with FIGS. 1a-b, the upper conductive grid 405 is here formed by conductive warp yarns 406a-b and conductive weft yarns 407a-b. In each upper grid element 404, three upper layer connection points 408, 409, 410 are formed by weft yarn loops from three respective separate lower conductive grids, as will be described in connection with FIGS. 4b-d.

Through the configuration illustrated in FIGS. 4a-d, three sets of electronic devices, such as differently colored LEDs can be controlled separately from each other, so that, for example, the color of light emitted by an electronic textile can be tuned across the color gamut defined by the LEDs employed.

Figure 4A:
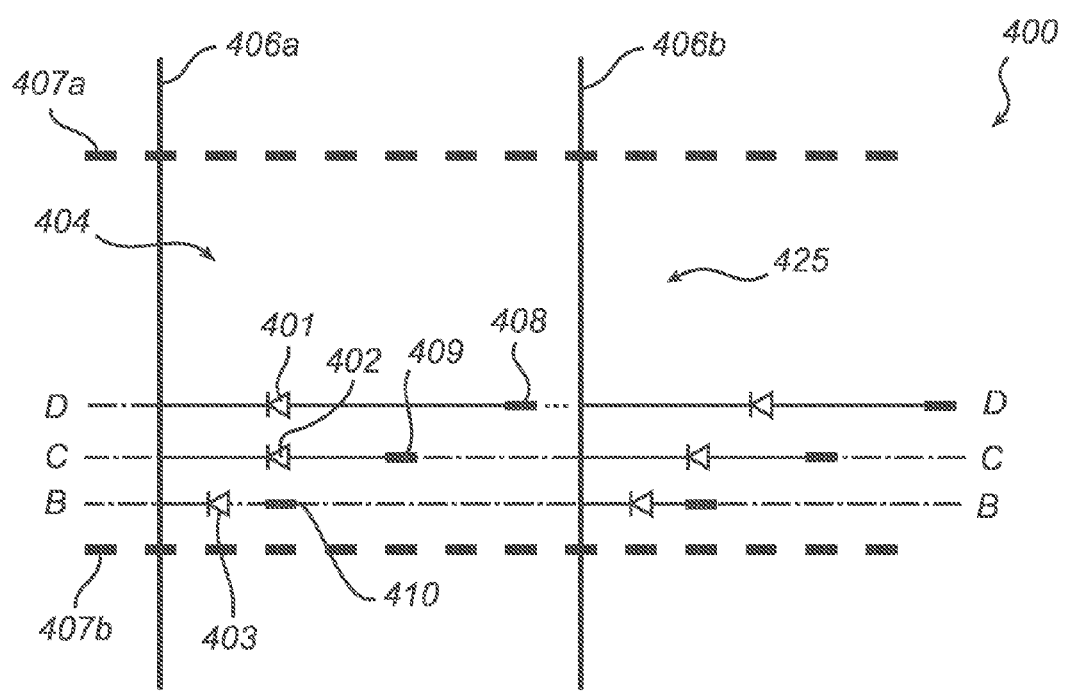
FIG. 4a is a schematic top view of a textile according to a third embodiment of the present invention, having electronic devices in the form of LEDs connected thereto.

In FIG. 4b, a cross-section view, as seen in the warp direction, of the textile 400 in FIG. 4a along the line B-B can be seen. As in previously described embodiments, the textile 400 is comprised of warp and weft yarns, the warp yarns being arranged in upper, lower and intermediate warp layers 101, 102, 103, the upper 101 and lower 102 layers having (selected) conductive 406a-b, 421a-d, and non-conductive 422a-m, 423a-m warp yarns, and the intermediate layer 103 having all non-conductive warp yarns. A conductive weft yarn 423 is interwoven with the warp yarns of the three warp layers 101, 102, 103 to cross conductive warp yarns 421b comprised in a first array of conductive warp yarns in the lower warp layer to achieve electrical contact between the conductive weft yarn 424 and the conductive warp yarns 421b. After crossing the conductive warp yarn 421b, the conductive weft yarn 424 forms a loop 425 around the non-conductive warp yarn 423f in the lower warp layer 102, the non-conductive warp yarn 426 in the intermediate layer 103 and the non-conductive warp yarn 422d in the upper warp layer 101 to enable connection of an electronic device, here in the form of LED 403 between the connection point formed by the loop 425 and a conductive warp yarn 406a in the first warp layer 101. After having completed the loop 425, the conductive weft yarn 424 avoids contact with conductive warp yarns 421c and 421d, which are comprised in two other lower conductive grids.

FIGS. 4c-d are cross-section views along the lines C-C and D-D, respectively, in FIG. 4a, and differ from FIG. 4b only in the arrangement of the conductive weft yarns. In FIG. 4c, the conductive weft yarn 430 crosses the conductive warp yarn 421c to achieve electrical contact there between and then forms a loop 431, enabling connection of LED 402 between the connection point formed by the loop 431 and a conductive warp yarn 406a. In FIG. 4d, the conductive weft yarn 440 crosses the conductive warp yarn 421d to achieve electrical contact there between and then forms a loop 441, enabling connection of LED 401 between the connection point formed by the loop 441 and a conductive warp yarn 406a. As an alternative to connecting three differently colored LEDs to each grid element 404 of the textile 400 as described above in connection with FIGS. 4a-d, other kinds of electronic devices may be connected between the upper conductive grid 405 and the lower conductive grids. For example, one LED, one solar cell and one battery may be connected between the upper conductive grid 405 and a respective one of the lower conductive grids, via the upper layer connection points 408, 409, and 410, respectively. Through such a configuration, the amount of external power needed to drive the LEDs may be significantly reduced.

Figure 5A:
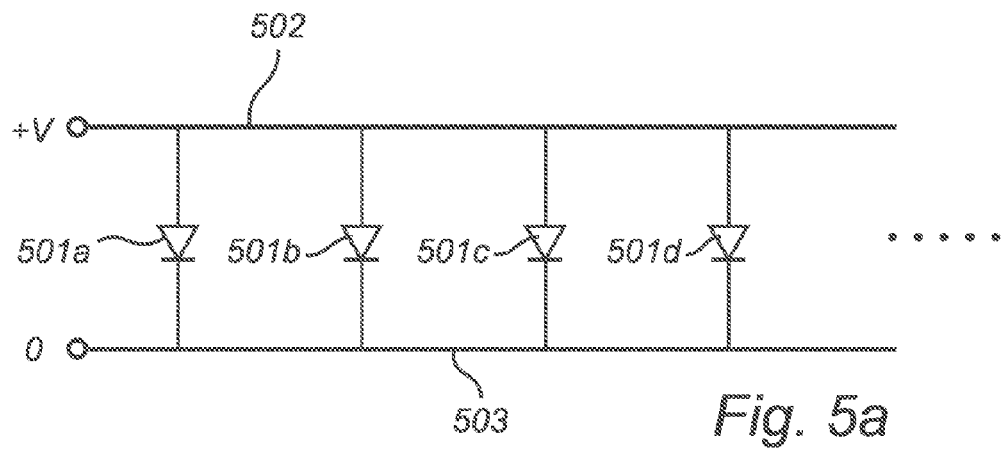
FIGS. 5a-c are schematic circuit diagrams showing three examples of possible electronic device configurations of an electronic textile according to the present invention.
Figure 5B:
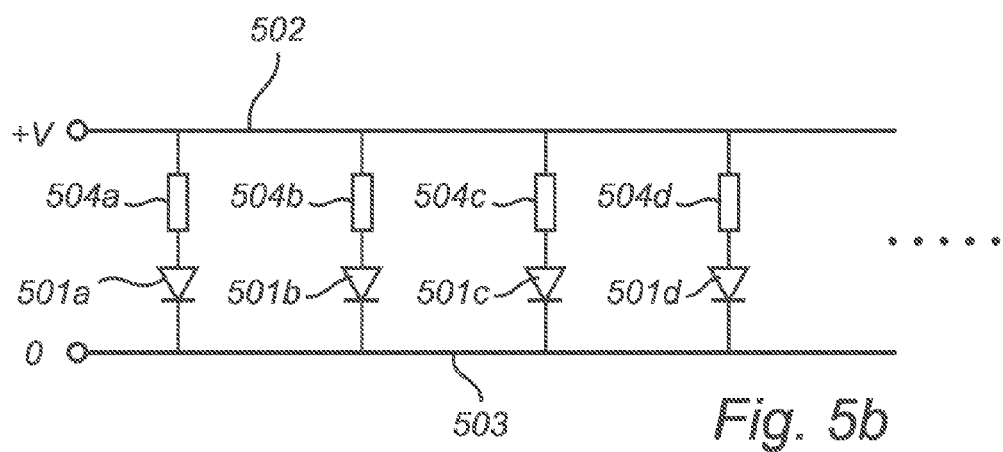
Figure 5C:
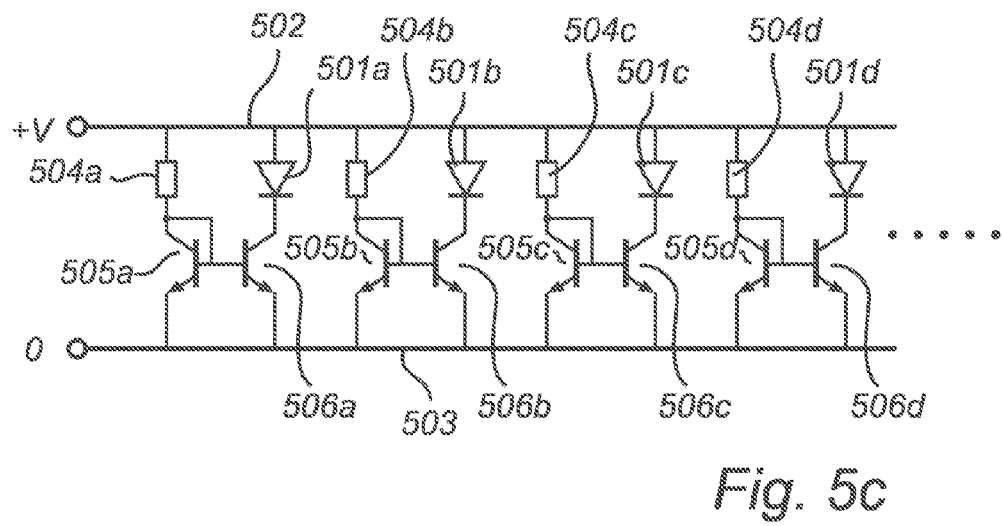

FIGS. 5a-c are schematic circuit diagrams showing three examples of possible electronic device configurations of an electronic textile according to the present invention. FIG. 5a shows a basic electrical circuit diagram showing a sequence of LEDs 501a-d that are connected to the same power 502 and ground 503 planes. This diagram represents the most basic implementation of this design. If the LEDs all have the same voltage-luminance characteristics, this electrical design is sufficient to for implementation in a cut to measure matrix.

If the LEDs do not have the same voltage-luminance characteristics, there may be very large differences in the current going through each of the LEDs 501a-d in the matrix illustrated in FIG. 5a.

Referring to FIG. 5b, a resistor 504a-d can be placed in front of each LED 501a-d. This resistor will act as a current source and will act as a first order stabilization circuit to provide a much narrower current range to each LED, and thereby a more uniform emission of light in the case of LEDs having different voltage-luminance characteristics.

Referring now to FIG. 5c, further stabilization of the LED-currents can be achieved by, for each LED 501 in the matrix, forming a current mirror system with the resistor 504, two transistors 505, 506, and the LED 501. This current mirror will act as a second order stabilization to the system, providing nearly constant currents to the different LEDs in the system.

The person skilled in the art realizes that the present invention by no means is limited to the preferred embodiments. For example, several conductive warp and/or weft yarns may be provided adjacent to each other to function correspondingly to what is in the above description and the appended drawings illustrated as single conductive warp and/or weft yarns. This "bundling" may increase the conductance and/or durability of the conductive yarns (yarn bundles). Furthermore, conductive warp yarns in the lower and upper warp layers may be translated or coincide in the weft direction. Additionally, although the above-described electronic device configurations include LEDs, resistors and transistors, it is readily realized by the skilled person that these components may be replaced by or complemented with several other types of components and devices. For example, the LEDs may be replaced by or complemented with sensors, communication devices, other lighting devices etc, and the resistors and transistors comprised in the above-described current stabilizing circuitry may be replaced by or complemented with other components, such as additional transistors, diodes etc.

The invention claimed is:

1. A textile, for enabling connection of electronic devices, formed from interwoven electrically conductive and non-conductive yarns, said textile comprising:
a multi-layer warp including:
an upper warp layer comprising an upper array of conductive warp yarns,
a lower warp layer comprising a lower array of conductive warp yarns, and
an intermediate warp layer arranged between said upper and lower warp layers; and
a weft comprising electrically conductive and non-conductive weft yarns including:
a first set of conductive weft yarns crossing said upper array of conductive warp yarns such that electrical contact is achieved between the first set of conductive weft yarns and said upper array of conductive warp yarns; and
a second set of conductive weft yarns crossing said lower array of conductive warp yarns, such that electrical contact is achieved between the second set of conductive weft yarns and said lower array of conductive warp yarns,
wherein said second set of conductive weft yarns, at selected loop locations, form loops around non-conductive warp yarns in said upper and intermediate warp layers,
each of said loops providing a first upper layer connection point for enabling connection of an electronic device between said first upper layer connection point and a second upper layer connection point provided on one of a conductive warp yarn from said upper array of conductive warp yarns and a conductive weft yarn from said first set of conductive weft yarns.

2. The textile as claimed in claim 1, wherein said first set of conductive weft yarns, at selected loop locations, form loops around non-conductive warp yarns in said lower and intermediate warp layers,
each of said loops providing a first lower layer connection point for enabling connection of an electronic device between said first lower layer connection point and a second lower layer connection point provided on one of a conductive warp yarn from said lower array of conductive warp yarns and a conductive weft yarn from said second set of conductive weft yarns.

3. The textile as claimed in claim 1, wherein:
electrical contact is achieved between each of said conductive yarns in said upper array of conductive warp yarns and said first set of conductive weft yarns, such that an upper conductive grid is formed comprising a plurality of upper grid elements;
electrical contact is achieved between each of said conductive yarns in said lower array of conductive warp yarns and said second set of conductive weft yarns, such that a lower conductive grid is formed comprising a plurality of lower grid elements; and
said loop locations are selected such that said loops enable connection of an electronic device between said upper and lower conductive grids for each grid element in at least one of said upper and lower grids.

4. The textile as claimed in claim 1, wherein:
at least said lower warp layer comprises a plurality of lower arrays of conductive warp yarns;
said conductive weft yarns are divided into a plurality of sets, wherein
each of said lower arrays of conductive warp yarns is crossed by a corresponding set of conductive weft yarns from said plurality of sets, such that electrical contact is achieved between each of said lower arrays of conductive warp yarns and the corresponding set of conductive weft yarns from said plurality of sets.

5. The textile as claimed in claim 1, wherein at least a fraction of said loops each are formed around a larger number of non-conductive warp yarns in said intermediate layer than in said upper layer.

6. An electronic textile comprising:
   a textile as claimed in claim 1; and
   a plurality of electronic devices, each being connected to said first and second connection points.

7. The electronic textile as claimed in claim 6, wherein each of said electronic devices comprises a light-emitting diode.

8. The electronic textile as claimed in claim 7, wherein each of said electronic devices further comprises stabilizer circuitry for compensating for different light-emitting diodes having different characteristics.

9. The electronic textile as claimed in claim 8, wherein said stabilizer circuitry comprises a resistor.

10. The electronic textile as claimed in claim 8, wherein said stabilizer circuitry comprises at least one transistor.

\* \* \* \* \*